US012801823B2

(12) United States Patent
Harb

(10) Patent No.: US 12,801,823 B2
(45) Date of Patent: Nov. 17, 2026

(54) INTEGRATED CIRCUIT DESIGN METHODOLOGY USING PHANTOM DESIGN WITHOUT PHYSICAL VIEW

(71) Applicant: Silicon Laboratories Inc., Austin, TX (US)

(72) Inventor: Mohammed Harb, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 737 days.

(21) Appl. No.: 18/203,781

(22) Filed: May 31, 2023

(65) Prior Publication Data

US 2024/0403535 A1 Dec. 5, 2024

(51) Int. Cl.
*G06F 30/392* (2020.01)
*G06F 30/398* (2020.01)
*H10D 89/10* (2025.01)

(52) U.S. Cl.
CPC .......... *G06F 30/398* (2020.01); *G06F 30/392* (2020.01); *H10D 89/10* (2025.01)

(58) Field of Classification Search
CPC ...... G06F 30/398; G06F 30/392; G06F 30/39; H10D 89/10
See application file for complete search history.

(56) References Cited

U.S. PATENT DOCUMENTS

2004/0111693 A1* 6/2004 Lin .......................... G03F 1/36 430/5
2008/0034332 A1* 2/2008 Anikin .................... G06F 30/39 716/54
2022/0277126 A1* 9/2022 Irissou .................... G06F 30/30

OTHER PUBLICATIONS

Cadence Design Systems, Inc., "RF Module Design and Development with Cadence AWR Software," www.cadence.com/go/awr, Nov. 2020, 10 pages.
Wikipedia, "Tape-Out," downloaded from https://en.wikipedia.org/w/index.php?title=Tape-out&oldid=1127817013 on May 31, 2023, 2 pages.
Wikipedia, "GDSII," downloaded from https://en.wikipedia.org/w/index.php?title=GDSII&oldid=1125342209 on May 31, 2023, 2 pages.

* cited by examiner

*Primary Examiner* — Nghia M Doan
(74) *Attorney, Agent, or Firm* — Zagorin Cave LLP

(57) ABSTRACT

Techniques for providing a representation of densities of layer material in an integrated circuit layout design without revealing actual layout design data to protect a vendor's proprietary design data are described. The representation of the density information is used to reduce or eliminate density violations at borders of distinct portions of the integrated circuit design. By exchanging standardized data in a density view database, the techniques described herein can be independent of the vendor. A method for manufacturing an integrated circuit includes generating a design density view database representing a first integrated circuit layout design by using layer density information associated with the first integrated circuit layout design as a proxy for actual layout design information.

17 Claims, 3 Drawing Sheets

INTEGRATED CIRCUIT DESIGN METHODOLOGY USING PHANTOM DESIGN WITHOUT PHYSICAL VIEW

BACKGROUND

Field of the Invention

This application is related to integrated circuits and more particularly to electronic design automation for integrated circuits.

Description of the Related Art

A typical integrated circuit includes one or more intellectual property (IP) designs created by one or more vendors. For example, a fabless semiconductor company designs an integrated circuit product using a circuit designed in-house and at least one circuit designed by an IP vendor that satisfies specifications provided by or approved by the fabless semiconductor company. The IP vendor completes verification for manufacturability of the design before providing a corresponding circuit layout database to a semiconductor foundry for manufacturing. However, to protect their intellectual property from theft, the IP vendor may not provide the corresponding circuit layout database to the fabless semiconductor company. Instead, the IP vendor provides only one or more models of the IP design to the fabless semiconductor company. While those models are useful for simulation of functionality and timing, a physical view is omitted. As a result, the fabless semiconductor company has an incomplete view of the integrated circuit product at the borders of the IP design in a physical layout view of the integrated circuit product used for verification for manufacturability. Density gradient violations are likely to take place between the borders of the IP design and other circuits adjacent to the IP design. Density gradient violations may be detected by the semiconductor foundry after tapeout when the semiconductor foundry merges and verifies a merged design including the circuit layout received from the IP vendor and the layout for the circuits designed by the fabless semiconductor company. Addressing any density gradient violations typically delays a project timeline. Accordingly, improved techniques for generating an integrated circuit design are desired.

SUMMARY OF EMBODIMENTS OF THE INVENTION

In at least one embodiment, a method for manufacturing an integrated circuit includes generating a design density view database representing a first integrated circuit layout design by using layer density information associated with the first integrated circuit layout design as a proxy for actual layout design information. The generating may include, for each layer and each density window of a design density database including the layer density information associated with the first integrated circuit layout design: extracting a density value for the layer in the density window, calculating layer material area in the density window based on the density value, and placing a number of geometric shapes of predetermined unit size with predetermined spacing in the density window corresponding to the layer material area and density value.

In at least one embodiment, a computer-aided design system includes a design density database including a plurality of density windows for each layer of a plurality of layers associated with a first integrated circuit layout design. The computer-aided design system includes a processor configured to generate a design density view database for the first integrated circuit layout design based on the design density database. The design density view database uses layer density information as a proxy for actual layout design information for the first integrated circuit layout design. For each layer and for each density window of the plurality of density windows, the processor may be configured to extract a density value for the layer in the density window, calculate layer material area in the density window, and place a number of geometric shapes of predetermined unit size with predetermined spacing in the density window corresponding to the layer material area and density value.

In at least one embodiment, a method for manufacturing an integrated circuit includes providing a design density database associated with a first integrated circuit layout design. The method includes providing a full design view database associated with the first integrated circuit layout design. In an embodiment, the method includes generating a layout design database based on a design density view database associated with the first integrated circuit layout design and a second integrated circuit layout design. The layout design database may include a phantom design corresponding to the first integrated circuit layout design. The design density view database may represent the first integrated circuit layout design using layer density information associated with the first integrated circuit layout design as a proxy for actual layout design information. The method may include generating the integrated circuit using the full design view database and the layout design database.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
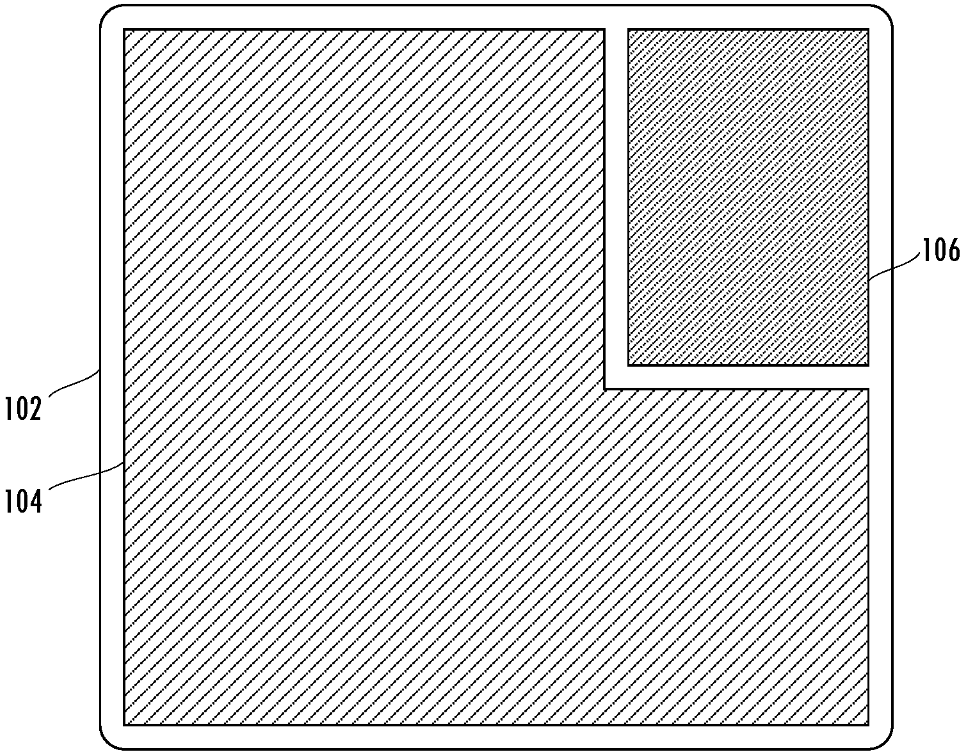
FIG. 1 illustrates a floorplan of an exemplary integrated circuit design.

Referring to FIG. 1, integrated circuit design 102 includes first circuit portion 106 provided by a first party (e.g., IP vendor or other integrated circuit design contractor) and circuit portion 104, designed by a second party (e.g., a fabless semiconductor manufacturer) or another party (e.g., another IP vendor). The second party merges a physical layout design database for integrated circuit portion 104 with a phantom design (i.e., a design that includes boundary information but no physical view information) for circuit portion 106. The second party may perform manufacturing-aware physical design techniques (e.g., dummy metal insertion or other physical design technique) on the merged database before verification (e.g., a design rule check) and authorization of a layout design database for integrated circuit design 102 for manufacture of an integrated circuit by a semiconductor foundry. In general, a layout design database includes a physical view (i.e., an integrated circuit layout, physical design, mask layout, or mask design) that is a representation of the integrated circuit in terms of planar geometric shapes that correspond to the patterns of metal, oxide or other semiconductor layers that are used to form the components of an integrated circuit. The first party provides a first layout design database directly to the semiconductor foundry for manufacturing of integrated circuit portion 106 as part of integrated circuit 102. The second party never receives that first layout database from the first party. Instead, the second party receives only the phantom design. The second party provides a layout design database for integrated circuit design 102 that includes the phantom design, to the semiconductor foundry for manufacturing, and the semiconductor foundry replaces the phantom design in the layout design database for integrated circuit design 102 with the first layout design for integrated circuit portion 106.

Although the layout design database for integrated circuit design 102 including the phantom design passes one or more design rule checks executed by the second party using Electronic Design Automation (EDA) tools, when the semiconductor foundry replaces the phantom design with the layout design database for integrated circuit portion 106, the layout design database for integrated circuit design 102 may no longer pass the one or more design rule checks. Accordingly, the semiconductor foundry delays the manufacture of integrated circuit design 102 until the semiconductor foundry, second party, or IP vendor addresses the failure (e.g., by redesigning integrated circuit portion 104, integrated circuit portion 106, or other portion of integrated circuit design 102). Any delay in manufacture can delay the time to market of a product, increase costs or result in lost revenue for the second party.

Figure 2:
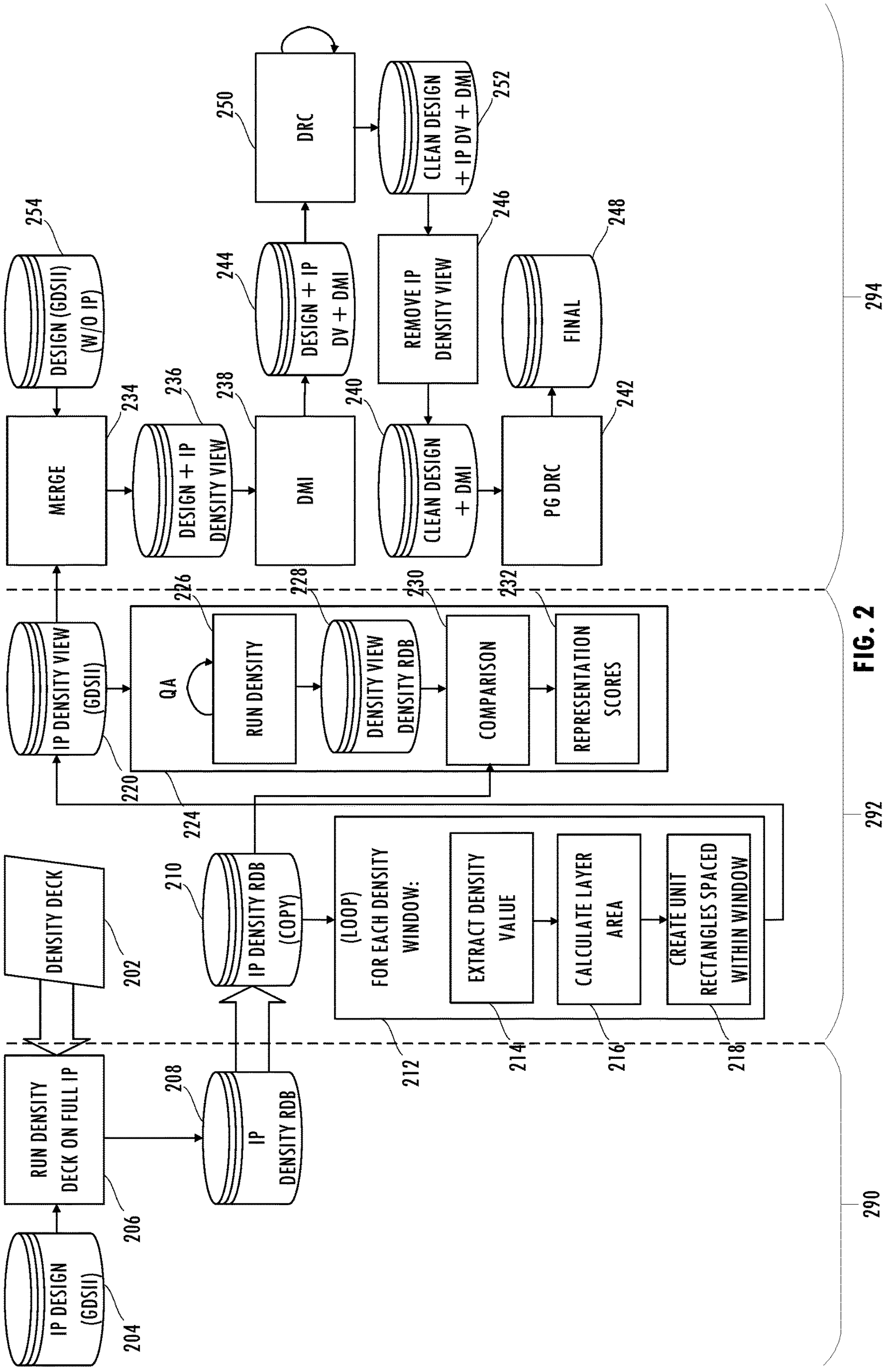
FIG. 2 illustrates an exemplary information flow of an integrated circuit design methodology consistent with at least one embodiment of the invention.

Referring to FIG. 2, a technique that reduces verification failures at the semiconductor foundry and reduces potential delays in manufacturing of an integrated circuit product that includes at least one circuit portion designed by an IP vendor provides additional information regarding the circuit portion(s) designed by the IP vendor to the fabless semiconductor manufacturer without providing the entire layout design database to the fabless semiconductor manufacturer. The IP vendor performs computer-aided design (CAD) and physical design, i.e., pattern generation (PG) (290). In at least one embodiment, CAD and PG 290 is implemented using corresponding scripts or other software stored in memory and executing on one or more processors that call Application Programming Interfaces (APIs) of CAD software and PG software, respectively, to generate IP density results database 208. CAD and PG 290 generates an IP design database 204, which includes information that defines geometric shapes (e.g., rectangles, trapezoids, and polygons) of layer material, defines the properties of each geometric shape of layer material, describes how they can be organized into cells containing patterns made by these shapes, and describes how each can be placed relative to each other. In at least one embodiment IP design database 204 uses a Graphic Design System II (GDSII) format. A GDSII format is a binary database file format representing planar geometric shapes, text labels, and other info about the layout in hierarchical form. The GDSII format is a conventional format for transfer of integrated circuit layout design data between design tools of different vendors, all of which operate with proprietary data formats. The GDSII format is typically the final output product of an integrated circuit design methodology that is provided to a semiconductor foundry for integrated circuit fabrication. Objects in a GDSII file are grouped by assigning numeric attributes including a layer number, data type, or text type. In other embodiments, Open Artwork System Interchange Standard (OASIS), or other formats are used.

CAD and PG 290 runs a density deck on a full IP layout design represented by IP design database 204 (206). That is, the IP vendor runs a script or other software that uses IP design database 204 and density deck 202. In at least one embodiment of CAD and PG 290, the IP vendor receives density deck 202 from the fabless semiconductor manufacturer. However, in other embodiments, the IP vendor receives density deck 202 from an EDA vendor, a semiconductor foundry, or other party. In at least one embodiment, density deck 202 includes instructions for calculating the density of portions of the full IP layout design. In at least one embodiment, the script partitions each layer of IP design database 204 into a grid of density windows and determines the density of material in each window of the layer. For example, the script generates IP density results database 208 by determining, for each layer of the IP layout design, the area of the layer material in each tile of a grid and divides by the area of the tile. The IP vendor provides IP density results database 210, which is a copy of IP density results database 208, to the fabless semiconductor manufacturer for use during CAD 292. In at least one embodiment, IP density results database 208 and IP density results database 210 include text descriptions of tiles used to calculate the density along with corresponding density values.

During CAD 292, the fabless semiconductor manufacturer uses IP density results database 210 to generate IP density view database 220. As referred to herein, a density view includes an imitation of design, i.e., includes density information without other physical layout information. The density view provides density information as a proxy for actual layout design information (i.e., conventional physical view information). In at least one embodiment, a script executing on a processor partitions each layer of an integrated circuit layout into a grid of density windows in the layer and performs loop 212 for each density window of each layer to generate IP density view database 220. In performing loop 212, the processor extracts a density value for the density window (214), calculates an area of layer material for the density window (216), and places within the density window a number of spaced unit rectangles (or other predetermined shape) representing layer material corresponding to the area of layer material (218). In at least one embodiment, shapes placed in IP density view database 220 obey manufacturing design rules to avoid design verification violations later.

In at least one embodiment, the fabless semiconductor manufacturer executes quality assurance analysis 224 (e.g., via a script or other software executing on one or more processors). In an embodiment, quality assurance analysis 224 runs density deck 202 on IP density view database 220 (226). In at least one embodiment, quality assurance analysis 224 partitions each layer of IP density view database 220 into a grid of density windows for the layer and measures the density of layer material represented in each density window of the layer. For example, quality assurance analysis 224 generates density view density results database 228 by determining the area of the layer material in each density window of a layer and divides by the area of the density window. Quality assurance analysis 224 compares (230) the density view density results database 228 to IP density results database 210 and provides an indication of the comparison. In at least one embodiment, quality assurance analysis 224 generates analytics based on the comparison.

For example, representation scores 232 indicate any error in density between IP density results database 210 and density view density results database 228. In at least one embodiment, the final representation score is 99%, i.e., 99% of layer material in IP density results database 210 is represented in IP density view database 220.

Figure 3:
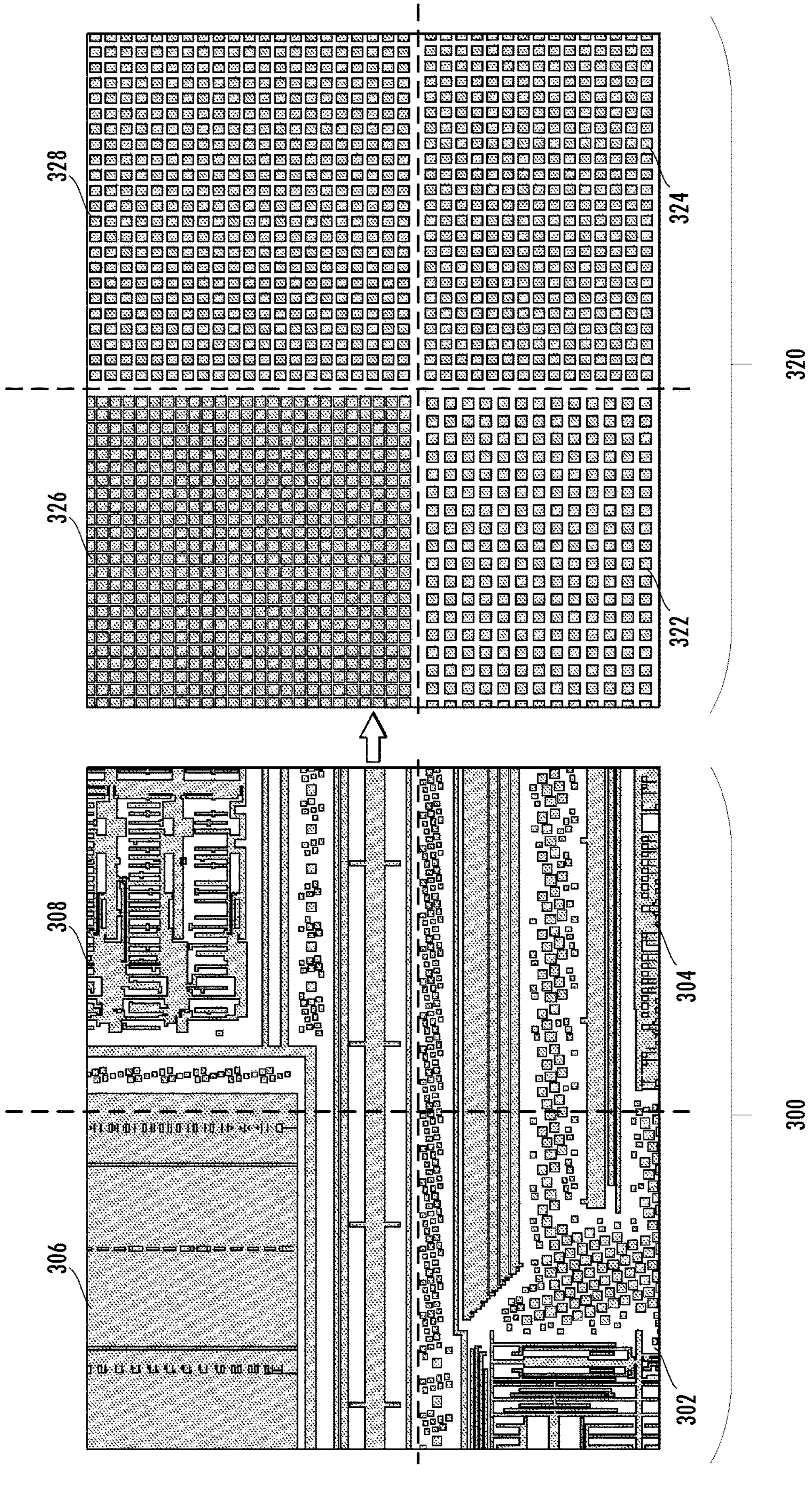
FIG. 3 illustrates a plan view of a portion of a layer of a physical layout of an IP design and a corresponding portion of a density view of the IP design consistent with at least one embodiment of the invention.

Referring to FIG. 3, portion 300 of a layer of an exemplary IP design database includes regions of varying density of layer material in a layer. Layer portions 302, 304, 306, and 308 are represented by density window portions 322, 324, 326, and 328, respectively, in portion 320 of a corresponding IP density view database. Density window portion 306 has the highest density structures in the layer and is represented by unit structures of layer material in density window 326 that are more densely positioned than structures of layer material in the other density window portions of the IP density view database.

Referring back to FIG. 2, after the fabless semiconductor manufacturer finishes CAD 292, the fabless semiconductor manufacturer performs PG 294, i.e., tapeout, which uses IP density view database 220, the final result of CAD 292, to generate final database 248 for use by a semiconductor foundry in generating photolithography masks for manufacturing the associated integrated circuit. In at least one embodiment, the fabless semiconductor manufacturer provides IP density view database 220 to a pattern generator (e.g., software executing on one or more processors), which performs PG 294 to generate final database 248. In at least one embodiment, PG 294 merges IP density view database 220 with design database 254, which is a layout design database (e.g., GDSII database) including the remainder of the integrated circuit design designed by the fabless semiconductor manufacturer (234). The merger of IP density view database 220 and design database 254 results in design +IP density view database 236. In at least one embodiment, PG 294 performs Dummy Metal Insertion (DMI), which inserts any filler shapes needed to satisfy metal density requirements for manufacturability (e.g., to improve uniformity) (238). In at least one embodiment, DMI 238 includes insertion of dummy vias, as needed. As a result, DMI 238 generates design+IP DV+DMI database 244, PG 294 performs verification including design rule checks (250), which generates clean design+IP DV+DMI database 252. In at least one embodiment, PG 294 iteratively runs design rule checks 250 to reduce or eliminate errors. In an embodiment of PG 294, a layout designer updates design database 254 in response to one or more errors identified by design rule checks 250, re-merges IP density view database 220 with design database 254, which includes the updates, and performs DMI 238 again, thereby regenerating design+IP DV+DMI database 244. Next, PG 294 removes the IP density view from clean design+IP DV+DMI database 252 (246) to generate clean design+DMI database 240. PG 294 then verifies clean design+DMI database 240 (e.g., performs PG DRC 242) to generate a final database 248, which includes no density violations or at most waivable density violations. Final database 248 includes an empty region where the IP design would be located.

In at least one embodiment, CAD 292 and PG 294 are implemented using corresponding CAD and PG scripts or other software stored in memory and executing on one or more processors that call APIs of CAD software and PG software, respectively, to generate IP density view database 220 and final database 248, respectively. The semiconductor foundry will verify manufacturability of the design represented by final database 248 and may make modifications to final database 248 before generating photolithography masks. Those modifications may include inserting custom structures to further improve manufacturability of the layout, generating a reticle layout with test patterns and alignment marks, layout-to-mask preparation, or other modifications in preparation for manufacturing.

In at least one embodiment, the density window size (e.g., 40 μm×40 μm) used by loop 212 is the same size as a window size used in uniformity checks or other DRC of PG 294. In at least one embodiment, IP density view database 220 is generated using shapes of another predetermined size (e.g., 500 nm×500 nm) and densities are compared by quality assurance analysis 224 using windows of yet another predetermined size (e.g., 200 μm×200 μm). However, other embodiments use different relationships between window sizes and shape sizes or different window sizes or different shape sizes. In at least one embodiment, the error in density between IP density results database 210 and IP density view database 220 is less than 1%.

Thus, techniques for providing a realistic representation of density of layer material in an IP design without revealing actual layout design data to protect an IP vendor's proprietary data are described. The realistic representation of the densities of layer material reduces or eliminates density violations on the borders of the IP design. By exchanging standardized data in an IP density view database, the techniques described herein can be independent of the IP vendor. The techniques reduce redesign, thus reducing development time and cost of manufacturing an integrated circuit including an IP block. The technique allows an IP vendor to protect their IP and maintain control of the layout design by disclosing the actual layout design directly to a semiconductor foundry without disclosing the actual layout design to a fabless semiconductor manufacturer.

The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location, or quality. For example, "a first received database," "a second received database," does not indicate or imply that the first received database occurs in time before the second received database. Software, as described herein, may be encoded in at least one tangible (i.e., non-transitory) computer readable medium. As referred to herein, a tangible computer-readable medium includes at least a disk, tape, or other magnetic, optical, or electronic storage medium. Persons of ordinary skill in the art will recognize a variety of design tools and languages appropriate for implementing the teachings described herein. Variations and modifications of the embodiments disclosed herein may be made based on the description set forth herein, without departing from the scope of the invention as set forth in the following claims.

What is claimed is:

1. A method comprising:

generating a design density view database representing a first integrated circuit layout design by using layer density information associated with the first integrated circuit layout design as a proxy for actual layout design information, wherein generating the design density view database comprises:

for each density window of each layer of a design density database including the layer density information associated with the first integrated circuit layout design:

extracting a density value for layer material in the density window;

calculating layer material area in the density window based on the density value; and placing a number of geometric shapes of predetermined unit size with predetermined spacing in the density window, the number being based on the layer material area.

2. The method as recited in claim 1 further comprising:

applying a density mapping to the design density view database including the layer density information associated with the first integrated circuit layout design to generate density view density results;

comparing the density view density results to a design density database and generating a confidence indicator based thereon; and selectively providing the design density view database to a pattern generator based on the confidence indicator.

3. The method as recited in claim 1 further comprising:

generating a layout design database based on the design density view database and a second integrated circuit layout design; and providing the layout design database to a semiconductor foundry, wherein the layout design database includes a phantom design corresponding to the first integrated circuit layout design.

4. The method as recited in claim 1 further comprising:

merging design density view elements of the design density view database with a second integrated circuit layout design to generate a merged design database including the design density view elements.

5. The method as recited in claim 4 further comprising:

selectively inserting dummy structures of layer material into a layer of the merged design database according to a layer density rule to generate an updated merged design database; and removing the design density view elements from the updated merged design database to generate a layout design database including a phantom design corresponding to the first integrated circuit layout design.

6. The method as recited in claim 1 further comprising:

providing density mapping rules to a vendor; and receiving, from the vendor, a design density database including the layer density information associated with the first integrated circuit layout design generated based on the density mapping rules.

7. The method as recited in claim 1 wherein the design density database includes density information for the first integrated circuit layout design without other physical layout information for the first integrated circuit layout design.

8. A computer-aided design system comprises:

a design density database including a plurality of density windows for each layer of a plurality of layers associated with a first integrated circuit layout design; and a processor configured to generate a design density view database for the first integrated circuit layout design based on the design density database wherein for each density window of the plurality of density windows of each layer of the plurality of layers, the processor is configured to:

extract a density value for layer material in the density window;

calculate layer material area in the density window based on the density value; and place a number of geometric shapes of predetermined unit size with predetermined spacing in the density window, the number being based on the layer material area, and, wherein the design density view database uses layer density information as a proxy for actual layout design information for the first integrated circuit layout design.

9. The computer-aided design system as recited in claim 8 wherein the processor is further configured to:

apply a density mapping to the density view density database to generate density view density results;

comparing the density view density results to the design density view database to generate a confidence indicator; and selectively providing the design density view database to a pattern generator based on the confidence indicator.

10. The computer-aided design system as recited in claim 8 further comprising:

a pattern generator configured to:

merge the design density view database with a second integrated circuit layout design to generate a merged design database including design density view elements;

selectively insert dummy structures of layer material into the merged design database according to a layer density rule to generate an updated merged design database; and remove the design density view elements of the design density view database from the updated merged design database to generate a layout design database including a phantom design corresponding to the first integrated circuit layout design.

11. The computer-aided design system as recited in claim 8 wherein the design density database includes density information for the first integrated circuit layout design without other physical layout information for the first integrated circuit layout design.

12. A method comprising:

providing a design density database associated with a first integrated circuit layout design, the design density database being provided by a vendor to a fabless semiconductor manufacturer; and providing a full design view database associated with the first integrated circuit layout design, the full design view database being based on the design density database, and wherein the full design view database is provided by the vendor to a semiconductor foundry for manufacturing of an integrated circuit based on the full design view database and based on a layout design database generated by the fabless semiconductor manufacturer using the design density database, wherein the layout design database is generated based on a design density view database associated with the first integrated circuit layout design and a second integrated circuit layout design, and wherein the design density view database is generated by, for each density window of each layer of the design density database:

extracting a density value for layer material in the density window;

calculating layer material area in the density window based on the density value; and placing a number of geometric shapes of predetermined unit size with predetermined spacing in the density window, the number being based on the layer material area.

13. The method as recited in claim 12, wherein the layout design database includes a phantom design corresponding to the first integrated circuit layout design, and wherein the design density view database represents the first integrated circuit layout design using layer density information associated with the first integrated circuit layout design as a proxy for actual layout design information.

14. The method as recited in claim 13 further comprising:

merging design density view elements of the design density view database with the second integrated circuit layout design to generate a merged design database including the design density view elements;

selectively inserting dummy structures of layer material into a layer of the merged design database according to a layer density rule to generate an updated merged design database; and removing the design density view elements from the updated merged design database to generate the layout design database including the phantom design.

15. The method as recited in claim 13 wherein generating the layout design database comprises:

applying density mapping rules to the first integrated circuit layout design to generate the design density database, wherein the design density view database is generated based on the design density database.

16. The method as recited in claim 12 further comprising:

applying density mapping rules to the design density view database to generate density view density results;

comparing the density view density results to the design density database to generate a confidence indicator; and selectively providing the design density view database to a pattern generator based on the confidence indicator.

17. The method as recited in claim 12 wherein the design density database includes density information for the first integrated circuit layout design without other physical layout information for the first integrated circuit layout design.

* * * * *